US012604689B2

(12) United States Patent
Cheng

(10) Patent No.: US 12,604,689 B2
(45) Date of Patent: Apr. 14, 2026

(54) BRACING STRUCTURE, SEMICONDUCTOR DEVICE WITH THE SAME, AND METHOD FOR FABRICATING THE SAME

(71) Applicant: NANYA TECHNOLOGY CORPORATION, New Taipei City (TW)

(72) Inventor: Min-Chung Cheng, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 339 days.

(21) Appl. No.: 18/413,414

(22) Filed: Jan. 16, 2024

(65) Prior Publication Data

US 2025/0210369 A1 Jun. 26, 2025

Related U.S. Application Data

(62) Division of application No. 18/395,799, filed on Dec. 26, 2023.

(51) Int. Cl.
  H01L 21/311 (2006.01)
  H10P 14/692 (2026.01)
    (Continued)

(52) U.S. Cl.
  CPC ...... H10P 50/283 (2026.01); H10P 14/69394 (2026.01); H10W 74/10 (2026.01); H10W 76/12 (2026.01)

(58) Field of Classification Search
  None
  See application file for complete search history.

(56) References Cited

U.S. PATENT DOCUMENTS 11,355,351 B2 * 6/2022 Jin ............................ H10P 50/73
2019/0341306 A1 11/2019 Yu et al.
      (Continued)

FOREIGN PATENT DOCUMENTS

CN 101026150 A 8/2007
CN 113990870 A 1/2022
      (Continued)

OTHER PUBLICATIONS

Office Action and and the search report mailed on Jun. 16, 2025 related to Taiwanese Application No. 113126057.
      (Continued)

*Primary Examiner* — Shamim Ahmed
(74) *Attorney, Agent, or Firm* — Xuan Zhang

(57) ABSTRACT

The present application discloses a support bracing structure, a semiconductor device with the support bracing structure, and a method for fabricating the semiconductor device with the support bracing structure. The support bracing structure includes a first bracing layer including two connection portions respectively positioned on top surfaces of two adjacent bottom electrodes, and a frame portion bridging the two connection portions; and a protection layer including a first portion positioned on and conforming to an inner surface of the frame portion and positioned between the two connection portions. The inner surface of the frame portion is normal to the top surfaces of the two adjacent bottom electrodes.

10 Claims, 24 Drawing Sheets

(51) Int. Cl.
  *H10P 50/28*   (2026.01)
  *H10W 74/10*   (2026.01)
  *H10W 76/12*   (2026.01)

(56)       References Cited

U.S. PATENT DOCUMENTS

| | | | | |
|---|---|---|---|---|
| 2020/0105683 | A1* | 4/2020 | Yen | H10D 62/115 |
| 2022/0045267 | A1* | 2/2022 | Guo | H10N 50/80 |
| 2023/0329127 | A1* | 10/2023 | Koty | H10N 70/24 |
| | | | | 257/4 |

FOREIGN PATENT DOCUMENTS

| | | | |
|---|---|---|---|
| CN | 114520195 | A | 5/2022 |
| CN | 117012651 | A | 11/2023 |
| TW | 201614895 | A | 4/2016 |
| TW | 202209567 | A | 3/2022 |
| TW | 202333251 | A | 8/2023 |

OTHER PUBLICATIONS

Summary translation of Office Action and and the search report mailed on Jun. 16, 2025 related to Taiwanese Application No. 113126057.
Office Action and Search Report mailed on Oct. 8, 2024 related to Taiwanese Application No. 113107043.

* cited by examiner

Figure 1:
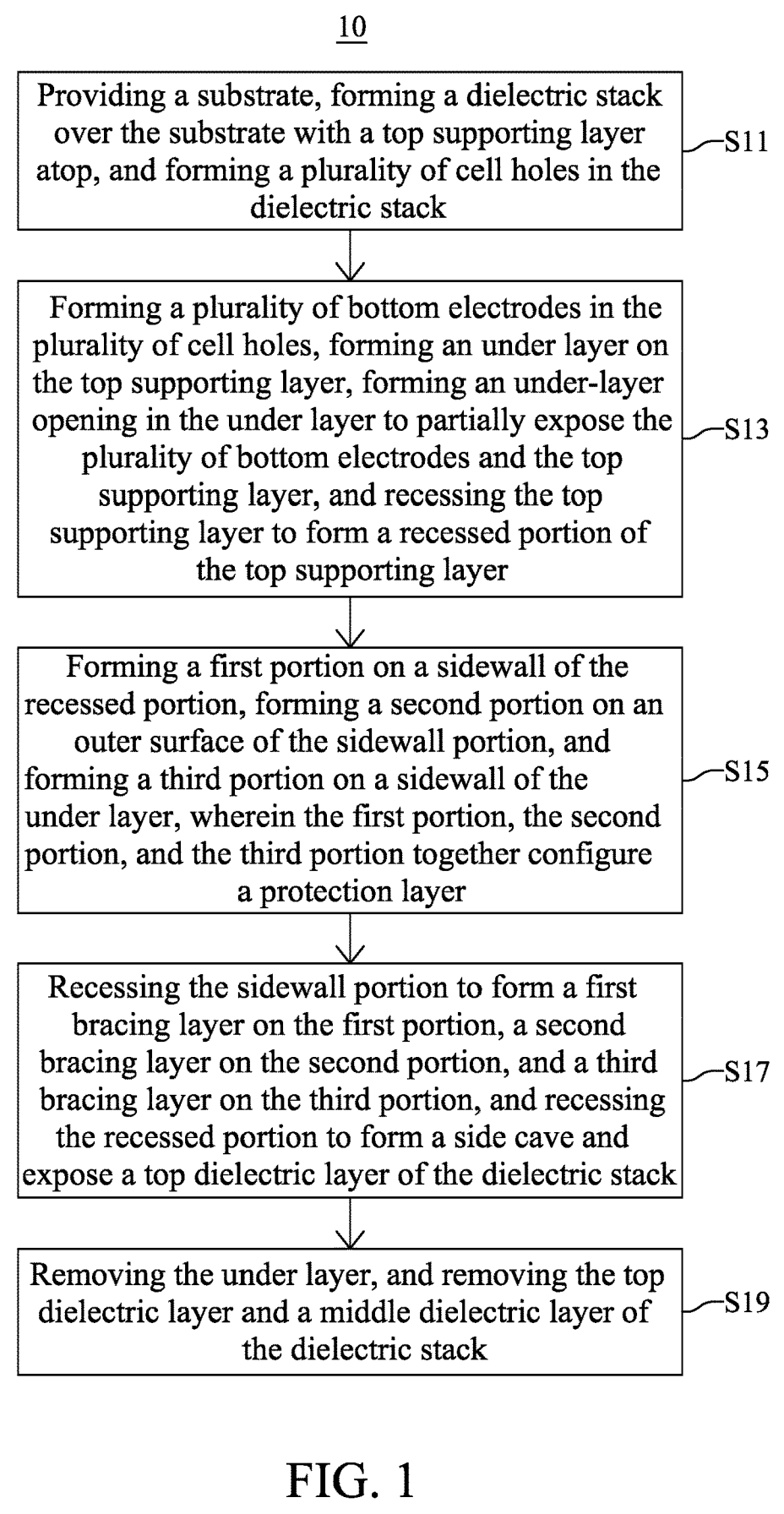

10

| Providing a substrate, forming a dielectric stack over the substrate with a top supporting layer atop, and forming a plurality of cell holes in the dielectric stack | S11 |

↓

| Forming a plurality of bottom electrodes in the plurality of cell holes, forming an under layer on the top supporting layer, forming an under-layer opening in the under layer to partially expose the plurality of bottom electrodes and the top supporting layer, and recessing the top supporting layer to form a recessed portion of the top supporting layer | S13 |

↓

| Forming a first portion on a sidewall of the recessed portion, forming a second portion on an outer surface of the sidewall portion, and forming a third portion on a sidewall of the under layer, wherein the first portion, the second portion, and the third portion together configure a protection layer | S15 |

↓

| Recessing the sidewall portion to form a first bracing layer on the first portion, a second bracing layer on the second portion, and a third bracing layer on the third portion, and recessing the recessed portion to form a side cave and expose a top dielectric layer of the dielectric stack | S17 |

↓

| Removing the under layer, and removing the top dielectric layer and a middle dielectric layer of the dielectric stack | S19 |

BRACING STRUCTURE, SEMICONDUCTOR DEVICE WITH THE SAME, AND METHOD FOR FABRICATING THE SAME

CROSS-REFERENCE TO RELATED APPLICATION

This application is a divisional application of U.S. Non-Provisional application Ser. No. 18/395,799 filed Dec. 26, 2023, which is incorporated herein by reference in its entirety.

TECHNICAL FIELD

The present disclosure relates to a bracing structure, a semiconductor device, and a method for fabricating the semiconductor device, and more particularly, to a semiconductor device with the bracing structure, and the method for fabricating the semiconductor device with the bracing structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a support bracing structure including a first bracing layer including two connection portions respectively positioned on top surfaces of two adjacent bottom electrodes, and a frame portion bridging the two connection portions; and a protection layer including a first portion positioned on and conforming to an inner surface of the frame portion and positioned between the two connection portions. The inner surface of the frame portion is normal to the top surfaces of the two adjacent bottom electrodes.

Another aspect of the present disclosure provides a semiconductor device including a substrate; at least two bottom electrodes positioned over the substrate and adjacent to each other; and a support bracing structure bridging the at least two bottom electrodes, wherein the support bracing structure includes a first bracing layer positioned on both top surfaces of the at least two adjacent bottom electrodes.

Another aspect of the present disclosure provides a method for fabricating a semiconductor device including providing a substrate, forming a dielectric stack over the substrate with a top supporting layer atop, and forming a plurality of cell holes in the dielectric stack; forming at least two adjacent bottom electrodes in the plurality of cell holes, wherein the at least two adjacent bottom electrodes respectively includes a bottom portion oriented parallel to the substrate and a sidewall portion extending normally and upwardly from a border of the bottom portion; forming an under layer over the top supporting layer, and forming an under-layer opening penetrating the under layer to partially expose the at least two adjacent bottom electrodes and the top supporting layer; recessing the top supporting layer to form a recessed portion of the top supporting layer that partially exposes outer surfaces of the sidewall portions of the at least two adjacent bottom electrodes; conformally forming a first portion of a protection layer on a sidewall of the recessed portion and a second portion of the protection layer on the outer surfaces of the sidewall portions; and recessing the sidewall portions to form a first bracing layer and a second bracing layer, wherein the first bracing layer is formed on both the first portion and top surfaces of the sidewall portions, and the second bracing layer is formed on the second portion. The first bracing layer, the second bracing layer, and the protection layer together configure a support bracing structure.

Due to the design of the semiconductor device of the present disclosure, the structure stability of the two adjacent bottom electrodes may be enhanced through the connection via the support bracing structure. This stabilization may prevent wobbling of the electrodes, thereby increasing the yield of the semiconductor device.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

DETAILED DESCRIPTION

Figure 2:
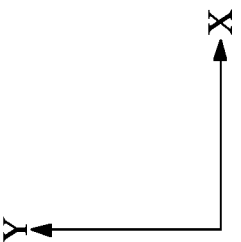
FIG. 2 illustrates, in a schematic top-view diagram, an intermediate semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that some elements may be omitted in top-view diagrams for clarity.

Figure 3:
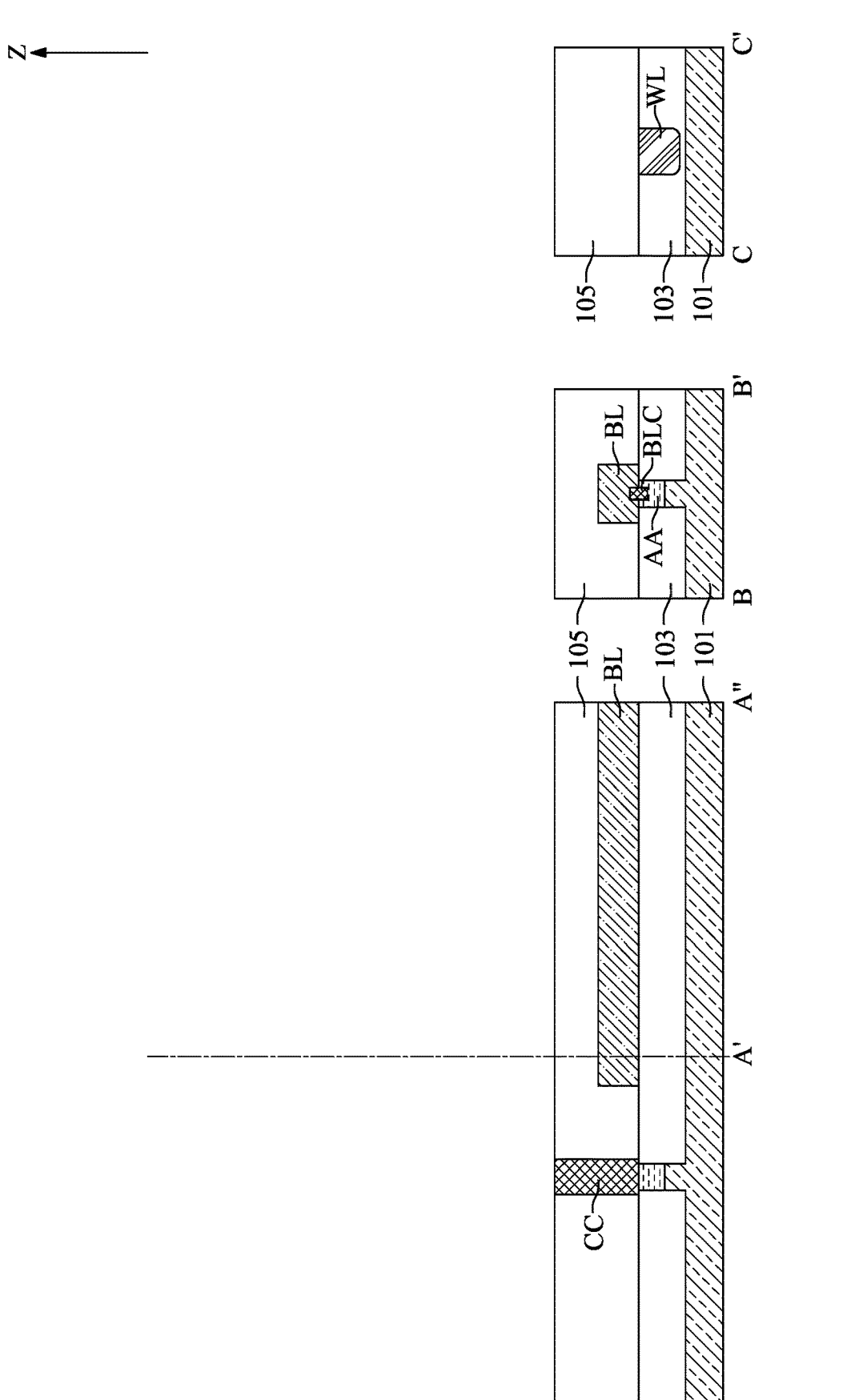
FIG. 3 is a schematic cross-sectional view diagram taken along lines A-A', B-B', and C-C' in FIG. 2 illustrating part of a flow for fabricating the semiconductor device in accordance with one embodiment of the present disclosure.
Figure 4:
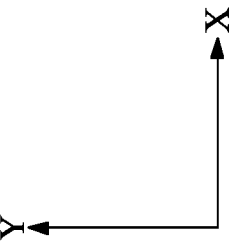
FIG. 4 illustrates, in a schematic top-view diagram, an intermediate semiconductor device in accordance with one embodiment of the present disclosure.
Figure 5:
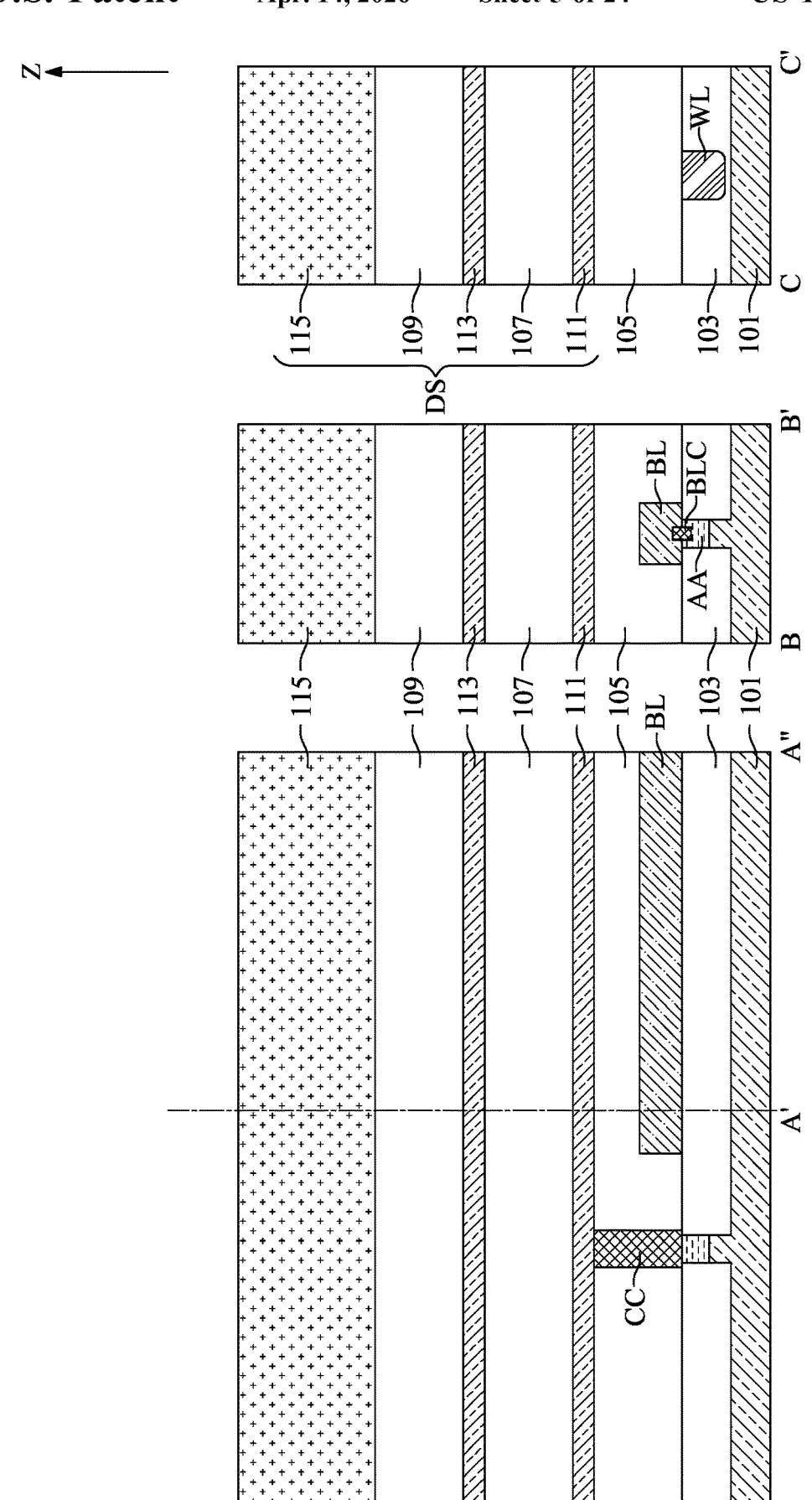
FIG. 5 is a schematic cross-sectional view diagram taken along lines A-A', B-B', and C-C' in FIG. 4 illustrating part of the flow for fabricating the semiconductor device in accordance with one embodiment of the present disclosure.
Figure 6:
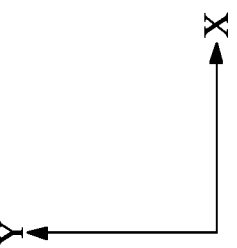
FIG. 6 illustrates, in a schematic top-view diagram, an intermediate semiconductor device in accordance with one embodiment of the present disclosure.
Figure 7:
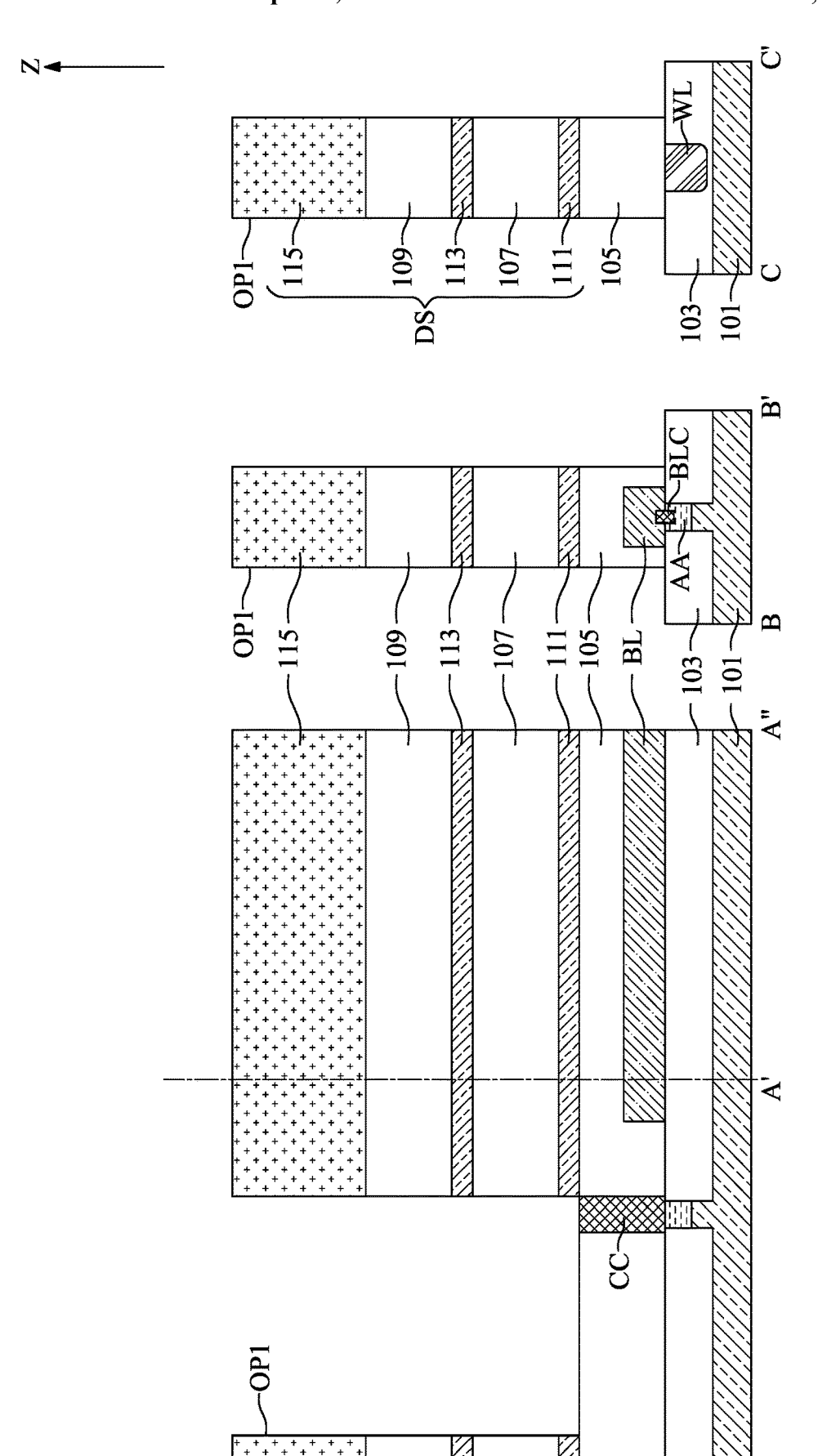
FIG. 7 is a schematic cross-sectional view diagram taken along lines A-A', B-B', and C-C' in FIG. 6 illustrating part of the flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A', B-B', and C-C' in FIG. 2 illustrating part of a flow for fabricating the semiconductor device 1A in accordance with one embodiment of the present disclosure. FIG. 4 illustrates, in a schematic top-view diagram, an intermediate semiconductor device in accordance with one embodiment of the present disclosure. FIG. 5 is a schematic cross-sectional view diagram taken along lines A-A', B-B', and C-C' in FIG. 4 illustrating part of the flow for fabricating the semiconductor device 1A in accordance with one embodiment of the present disclosure. FIG. 6 illustrates, in a schematic top-view diagram, an intermediate semiconductor device in accordance with one embodiment of the present disclosure. FIG. 7 is a schematic cross-sectional view diagram taken along lines A-A', B-B', and C-C' in FIG. 6 illustrating part of the flow for fabricating the semiconductor device 1A in accordance with one embodiment of the present disclosure.

With reference to FIGS. 1 to 7, at step S11, a substrate 101 may be provided, a dielectric stack DS may be formed over the substrate 101 with a top supporting layer 115 atop, and a plurality of cell holes OP1 may be formed in the dielectric stack DS.

With reference to FIGS. 2 and 3, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

An isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials. In some embodiments, the isolation layer 103 may define a plurality of active areas AA of the substrate 101.

In some embodiments, a plurality of word lines WL may be formed transversely across with the plurality of active areas AA in a top-view perspective. The plurality of word lines WL may be formed in the isolation layer 103 and the substrate 101 in a cross-sectional perspective.

In some embodiments, a plurality of bit lines BL (only one is shown in FIG. 2) may be formed perpendicular to the word line WL and across with the plurality of active areas AA in a top-view perspective. The plurality of bit lines BL may be formed on the isolation layer 103 in a cross-sectional perspective.

In some embodiments, a plurality of bit line contact BLC (only one is shown in FIG. 3) may be formed between the plurality of bit lines BL and the plurality of active areas AA to electrically connect the plurality of bit lines BL and the plurality of active areas AA, respectively and correspondingly.

In some embodiments, a bottom dielectric layer 105 may be formed on the isolation layer 103 and cover the plurality of bit lines BL. The bottom dielectric layer 105 may be formed of, for example, silicon oxide, low-k dielectric material, or other applicable dielectric materials.

In some embodiments, a plurality of cell contacts CC may be formed in the bottom dielectric layer 105 and electrically connected to the plurality of active areas AA.

With reference to FIGS. 4 and 5, the dielectric stack DS may be formed on the bottom dielectric layer 105. The dielectric stack DS may include a bottom supporting layer 111, a middle dielectric layer 107, a middle supporting layer 113, a top dielectric layer 109, and the top supporting layer 115.

The bottom supporting layer 111 may be formed on the bottom dielectric layer 105. In some embodiments, the bottom supporting layer 111 may be formed of, for example, silicon nitride or other applicable insulating material. In some embodiments, the bottom supporting layer 111 may be formed by, for example, chemical vapor deposition or other applicable deposition processes.

The middle dielectric layer 107 may be formed on the bottom supporting layer 111. In some embodiments, the middle dielectric layer 107 may be formed of, for example, borophosphosilicate glass or other applicable dielectric oxide. In some embodiments, the middle dielectric layer 107 may be formed by, for example, chemical vapor deposition or other applicable deposition processes.

The middle supporting layer 113 may be formed on the middle dielectric layer 107. In some embodiments, the middle supporting layer 113 may be formed of, for example, silicon nitride or other applicable insulating material. In some embodiments, the middle supporting layer 113 may be formed by, for example, chemical vapor deposition or other applicable deposition processes.

The top dielectric layer 109 may be formed on the middle supporting layer 113. In some embodiments, the top dielectric layer 109 may be formed of, for example, silicon oxide. In some embodiments, the top dielectric layer 109 may be formed by, for example, chemical vapor deposition using tetraethyl orthosilicate or other applicable deposition processes.

The top supporting layer 115 may be formed on the top dielectric layer 109. In some embodiments, the top supporting layer 115 may be formed of, for example, silicon nitride or other applicable insulating material. In some embodiments, the top supporting layer 115 may be formed by, for example, chemical vapor deposition or other applicable deposition processes.

With reference to FIGS. 6 and 7, in a cross-sectional perspective, the plurality of cell holes OP1 may be formed penetrating through the dielectric stack DS. The plurality of cell contacts CC may be exposed through the plurality of cell holes OP1. In some embodiments, in a top-view perspective, each of the plurality of cell holes OP1 may have a circular cross-sectional profile but is not limited thereto. In some embodiments, in a top-view perspective, the plurality of cell holes OP1 (e.g., four cell holes OP1) may be arranged in proximity to each other, positioned at the corners of an imaginary square or diamond shape. These cell holes OP1 may be placed near each other without any physical contact, maintaining a distinct gap between each cell hole OP1.

Figure 8:
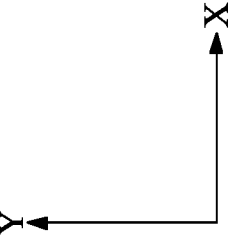
FIG. 8 illustrates, in a schematic top-view diagram, an intermediate semiconductor device in accordance with one embodiment of the present disclosure.
Figure 9:
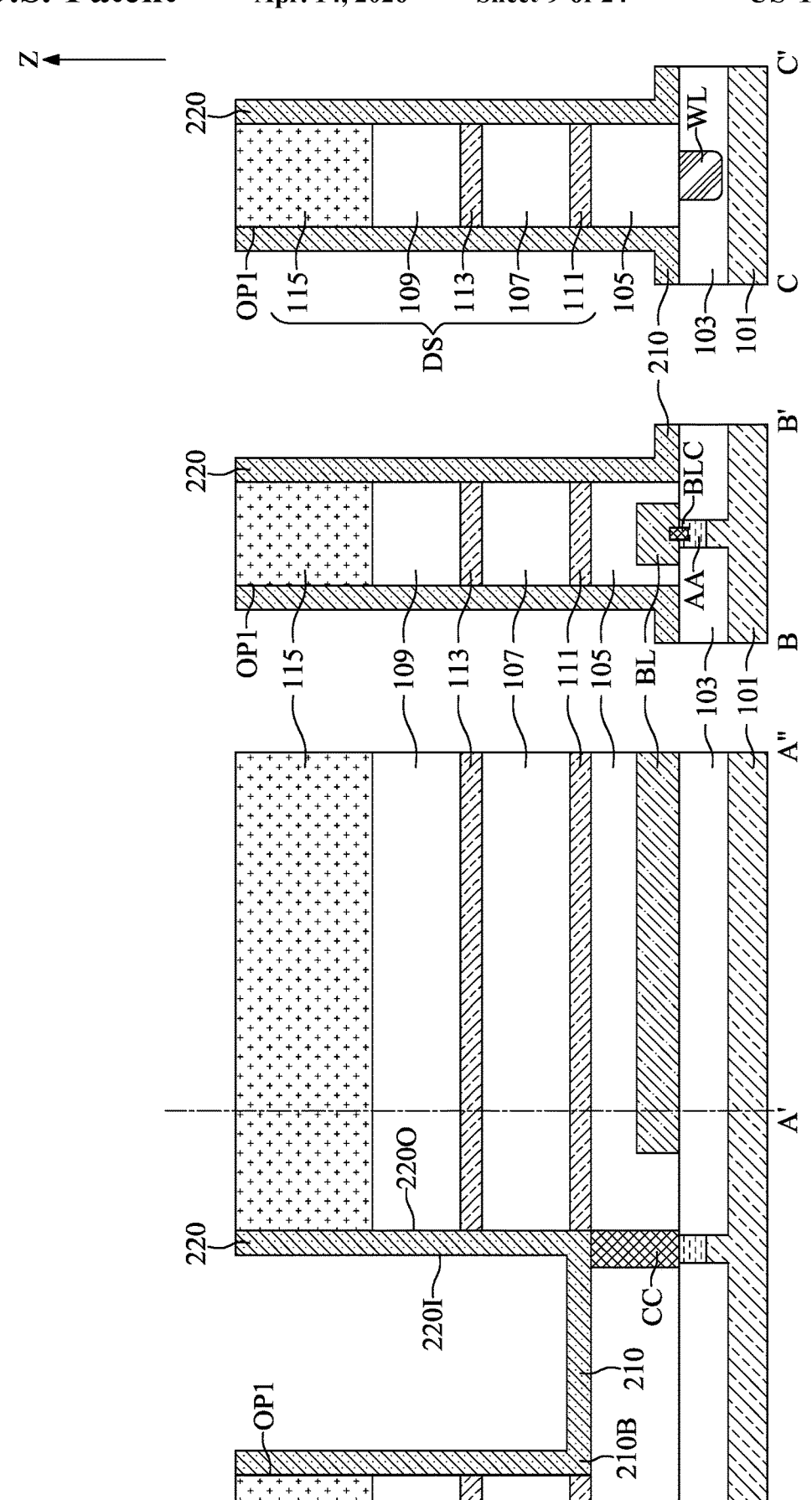
FIG. 9 is a schematic cross-sectional view diagram taken along lines A-A', B-B', and C-C' in FIG. 8 illustrating part of the flow for fabricating the semiconductor device in accordance with one embodiment of the present disclosure.
Figure 10:
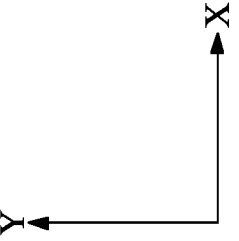
FIG. 10 illustrates, in a schematic top-view diagram, an intermediate semiconductor device in accordance with one embodiment of the present disclosure.
Figure 11:
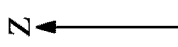
FIGS. 11 to 13 are schematic cross-sectional view diagrams taken along lines A-A', B-B', and C-C' in FIG. 10 illustrating part of the flow for fabricating the semiconductor device in accordance with one embodiment of the present disclosure.
Figure 12:
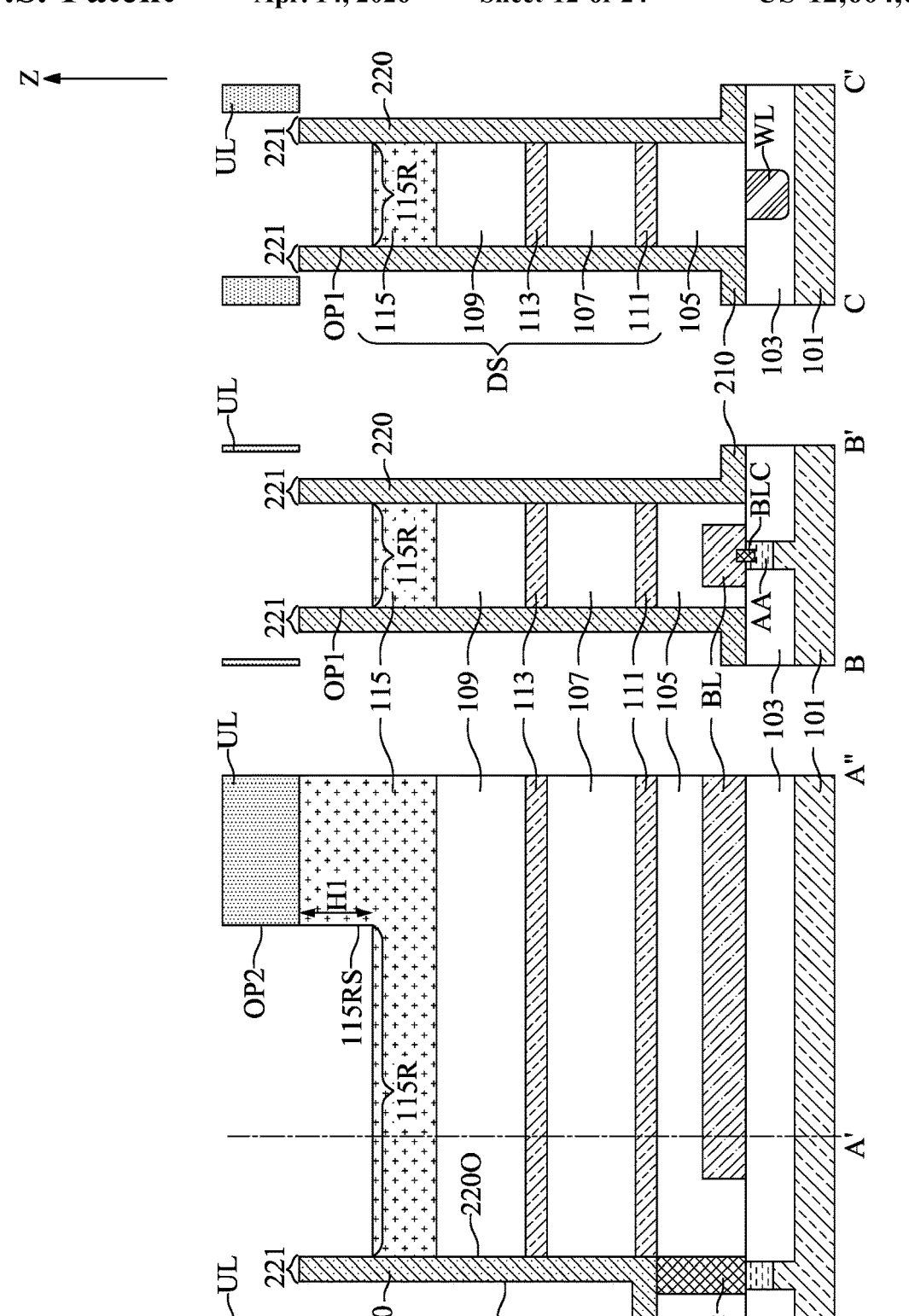
Figure 13:
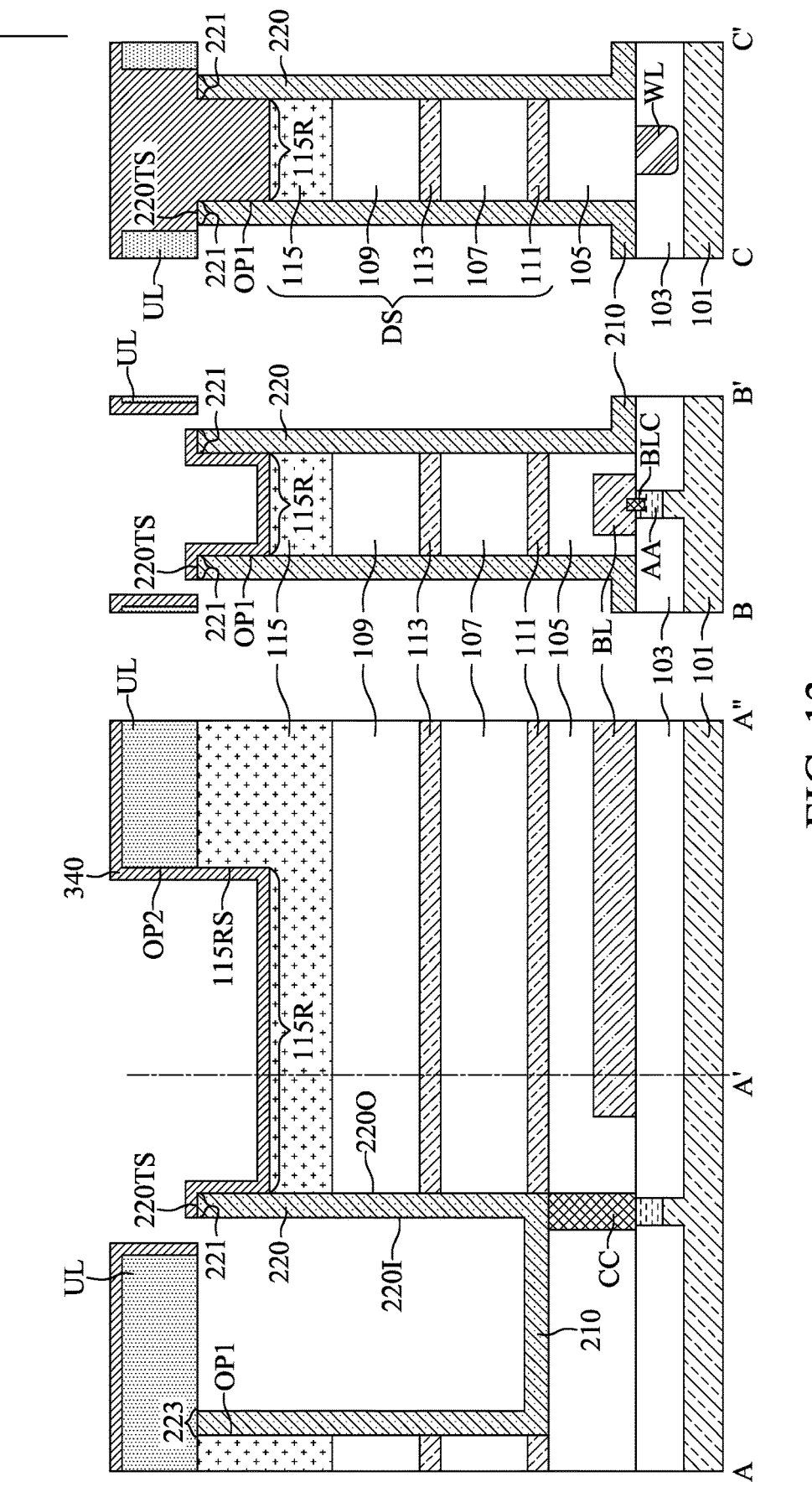
Figure 14:
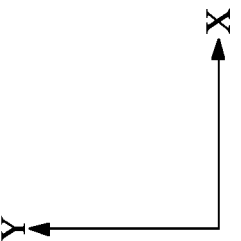
FIG. 14 illustrates, in a schematic top-view diagram, an intermediate semiconductor device in accordance with one embodiment of the present disclosure.
Figure 15:
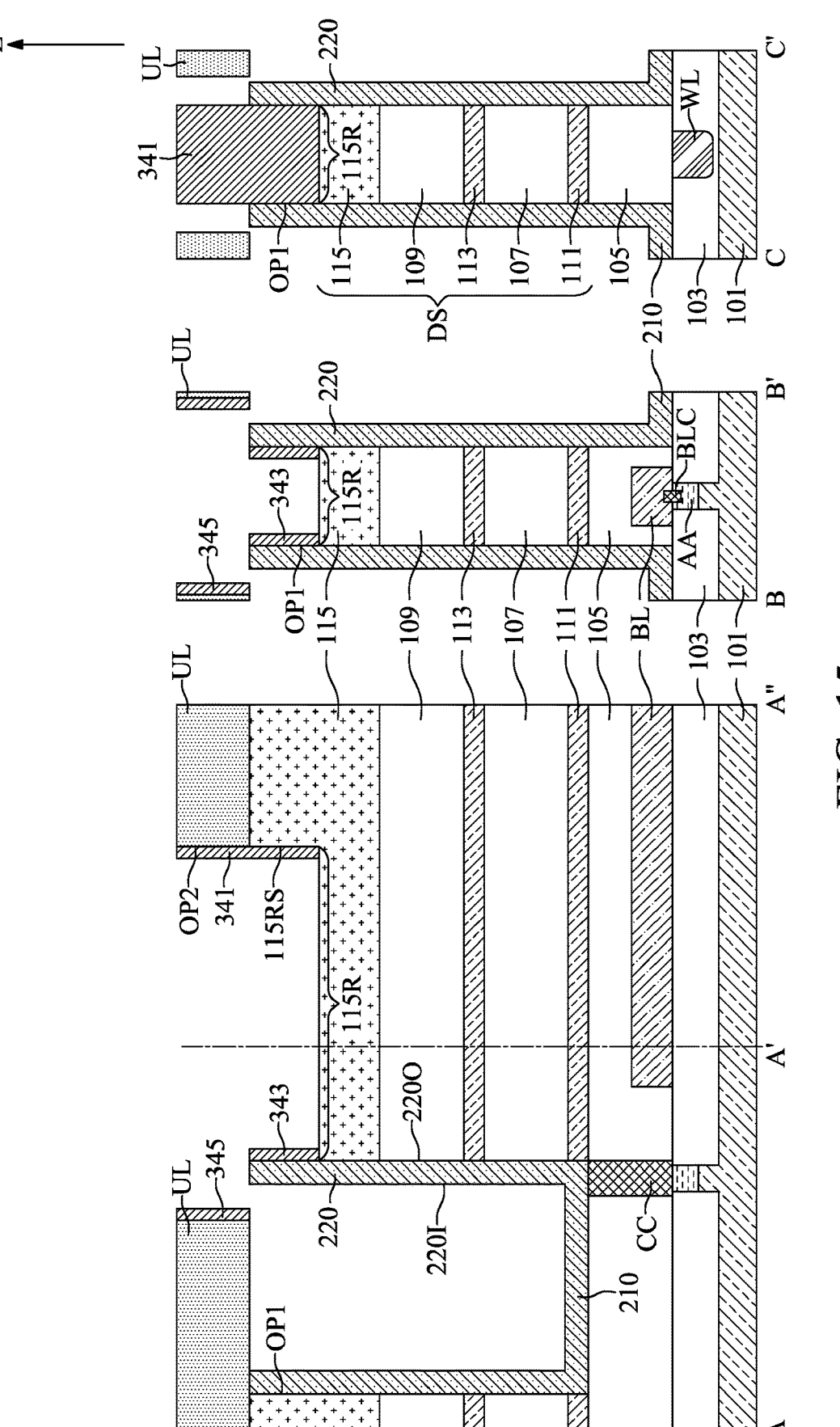
FIG. 15 is a schematic cross-sectional view diagram taken along lines A-A', B-B', and C-C' in FIG. 14 illustrating part of the flow for fabricating the semiconductor device 1A in accordance with one embodiment of the present disclosure.

FIG. 8 illustrates, in a schematic top-view diagram, an intermediate semiconductor device in accordance with one embodiment of the present disclosure. FIG. 9 is a schematic cross-sectional view diagram taken along lines A-A', B-B', and C-C' in FIG. 8 illustrating part of the flow for fabricating the semiconductor device 1A in accordance with one embodiment of the present disclosure. FIG. 10 illustrates, in a schematic top-view diagram, an intermediate semiconductor device in accordance with one embodiment of the present disclosure. FIGS. 11 to 13 are schematic cross-sectional view diagrams taken along lines A-A', B-B', and C-C' in FIG. 10 illustrating part of the flow for fabricating the semiconductor device 1A in accordance with one embodiment of the present disclosure. FIG. 14 illustrates, in a schematic top-view diagram, an intermediate semiconductor device in accordance with one embodiment of the present disclosure. FIG. 15 is a schematic cross-sectional view diagram taken along lines A-A', B-B', and C-C' in FIG. 14 illustrating part of the flow for fabricating the semiconductor device 1A in accordance with one embodiment of the present disclosure.

With reference to FIG. 1 and FIGS. 8 to 12, at step S13, a plurality of bottom electrodes 200 may be formed in the plurality of cell holes OP1, an under layer UL may be formed on the top supporting layer 115, an under-layer opening OP2 may be formed in the under layer UL to partially expose the plurality of bottom electrodes 200 and the top supporting layer 115, and the top supporting layer 115 may be recessed to form a recessed portion 115R of the top supporting layer 115.

With reference to FIGS. 8 and 9, the plurality of bottom electrodes 200 may be formed in the plurality of cell holes OP1, respectively and correspondingly. In a top-view perspective, the plurality of bottom electrodes 200 may have the same arrangement as the plurality of cell holes OP1. That is, the plurality of bottom electrodes 200 (e.g., four bottom electrodes 200) may be arranged in proximity to each other, positioned at the corners of an imaginary square or diamond shape. These bottom electrodes 200 may be placed near each other without any physical contact, maintaining a distinct gap between each bottom electrode 200. In some embodiments, each of the plurality of bottom electrodes 200 may have a circular, square, rectangular or other suitably shaped cross-sectional profile in a top-view perspective.

In a cross-sectional perspective, each of the plurality of bottom electrodes 200 may include a bottom portion 210 and a sidewall portion 220. The bottom portion 210 may be formed on the bottom supporting layer 111 and within the cell hole OP1. The bottom portion 210 may be electrically connected to the cell contact CC. The sidewall portion 220 may be formed extending normally and upward from the border 210B of the bottom portion. The bottom electrode 200 may have a U-shaped cross-sectional profile in a cross-sectional perspective. The sidewall portion 220 may include an inner surface 220I, an outer surface 220O, and a top surface 220TS. Both the inner surface 220I and the outer surface 220O may be parallel to each other and may be perpendicular to the bottom portion 210. The outer surface 220O may be attached to the sidewall of the cell hole OP1. The top surface 220TS may be parallel to the bottom portion 210 and may also be referred to as the top surface of the bottom electrode 200.

In some embodiments, the plurality of bottom electrodes 200 may be formed of, for example, titanium nitride, platinum, tantalum, tantalum nitride, doped polysilicon, or other applicable conductive materials. In some embodiments, the plurality of bottom electrodes 200 may be formed of, for example, titanium nitride. In some embodiments, the plurality of bottom electrodes 200 may be formed by, for example, atomic layer deposition, chemical vapor deposition, physical vapor deposition, or other applicable deposition processes.

With reference to FIGS. 10 and 11, the under layer UL may be formed on the top supporting layer 115. The under-layer opening OP2 may be formed penetrating the under layer UL by a photolithography process. Part of the plurality of bottom electrodes 200 may be exposed through the under-layer opening OP2. Detailedly, the under-layer opening OP2 may be strategically formed and sized to partially expose a section of each of the plurality of bottom electrodes 200 (e.g., four bottom electrodes 200) simultaneously. The arrangement may allow for a portion of the plurality of bottom electrodes 200 to be exposed through the under-layer opening OP2, providing both coverage and selective exposure. The sidewall portion 220 exposed through the under-layer opening OP2 may be referred to as the exposed segment 221 of the sidewall portion 220. The sidewall portion 220 covered by the under layer UL may be referred to as the intact segment 223 of the sidewall portion 220.

With reference to FIG. 12, an etching process may be performed to recess the top supporting layer 115 exposed through the under-layer opening OP2. In some embodiments, the etching process may be an anisotropic dry etching process. In some embodiments, the etching process may use an etchant including sulfur hexafluoride, argon, and chlorine. After the etching process, the recessed portion 115R of the top supporting layer 115 may be formed. A sidewall 115RS of the recessed portion 115R and a portion of the outer surface 220O of the exposed segment 221 of the sidewall portion 220 may be exposed through the under-layer opening OP2. In some embodiments, the height H1 of the sidewall 115RS may be between about 40 nm and about 70 nm, or between about 45 nm and about 55 nm, or about 50 nm. The sidewall 115RS may be substantially coplanar with the under-layer opening OP2 of the under layer UL.

With reference to FIG. 1 and FIGS. 13 to 15, at step S15, a first portion 341 may be formed on the sidewall 115RS of the recessed portion 115R, a second portion 343 may be formed on the outer surface 220O of the sidewall portion 220, and a third portion 345 may be formed on a sidewall of the under layer UL, wherein the first portion 341, the second portion 343, and the third portion 345 together configure a protection layer 340.

With reference to FIG. 13, the protection layer 340 may be conformally formed over the intermediate semiconductor device illustrated in FIG. 12. Detailedly, the protection layer 340 may be formed on the top surface 220TS of the sidewall portion 220, the outer surface 220O of the exposed segment 221 of the sidewall portion 220, the recessed portion 115R, the sidewall 115RS of the recessed portion 115R, the top surface of the under layer UL, and the sidewall of the under layer UL (i.e., the under-layer opening OP2). In some embodiments, the protection layer 340 may be formed of, for example, an oxide. In some embodiments, the protection layer 340 may be formed of, for example, silicon oxide or other applicable dielectric oxide. In some embodiments, the protection layer 340 may be formed by, for example, atomic layer deposition or other applicable deposition processes.

With reference to FIGS. 14 and 15, an etching process such as an anisotropic dry etching process may be performed to partially remove the protection layer 340. Detailedly, the protection layer 340 formed on the top surface 220TS of the sidewall portion 220, the recessed portion 115R, and the top surface of the under layer UL may be removed. The protection layer 340 that remains on the sidewall 115RS may be referred to as the first portion 341 of the protection layer 340.

The protection layer 340 that remains on the outer surface 220O of the exposed segment 221 of the sidewall portion 220 may be referred to as the second portion 343 of the protection layer 340. The protection layer 340 that remains on the sidewall of the under layer UL may be referred to as the third portion 345 of the protection layer 340.

Figure 16:
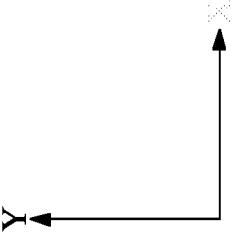
FIG. 16 illustrates, in a schematic top-view diagram, an intermediate semiconductor device in accordance with one embodiment of the present disclosure.
Figure 17:
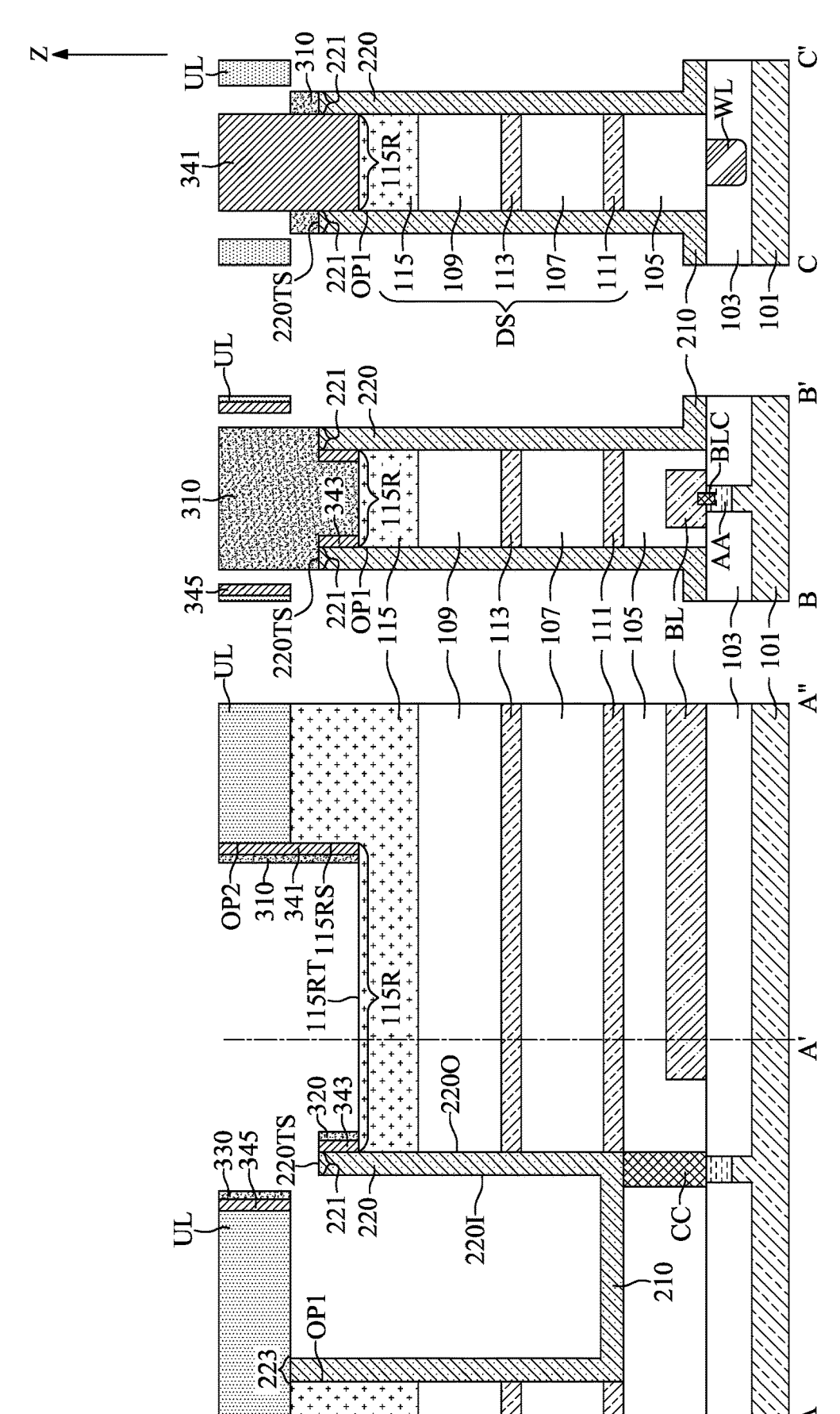
FIGS. 17 and 18 are schematic cross-sectional view diagrams taken along lines A-A', B-B', and C-C' in FIG. 16 illustrating part of the flow for fabricating the semiconductor device in accordance with one embodiment of the present disclosure.
Figure 18:
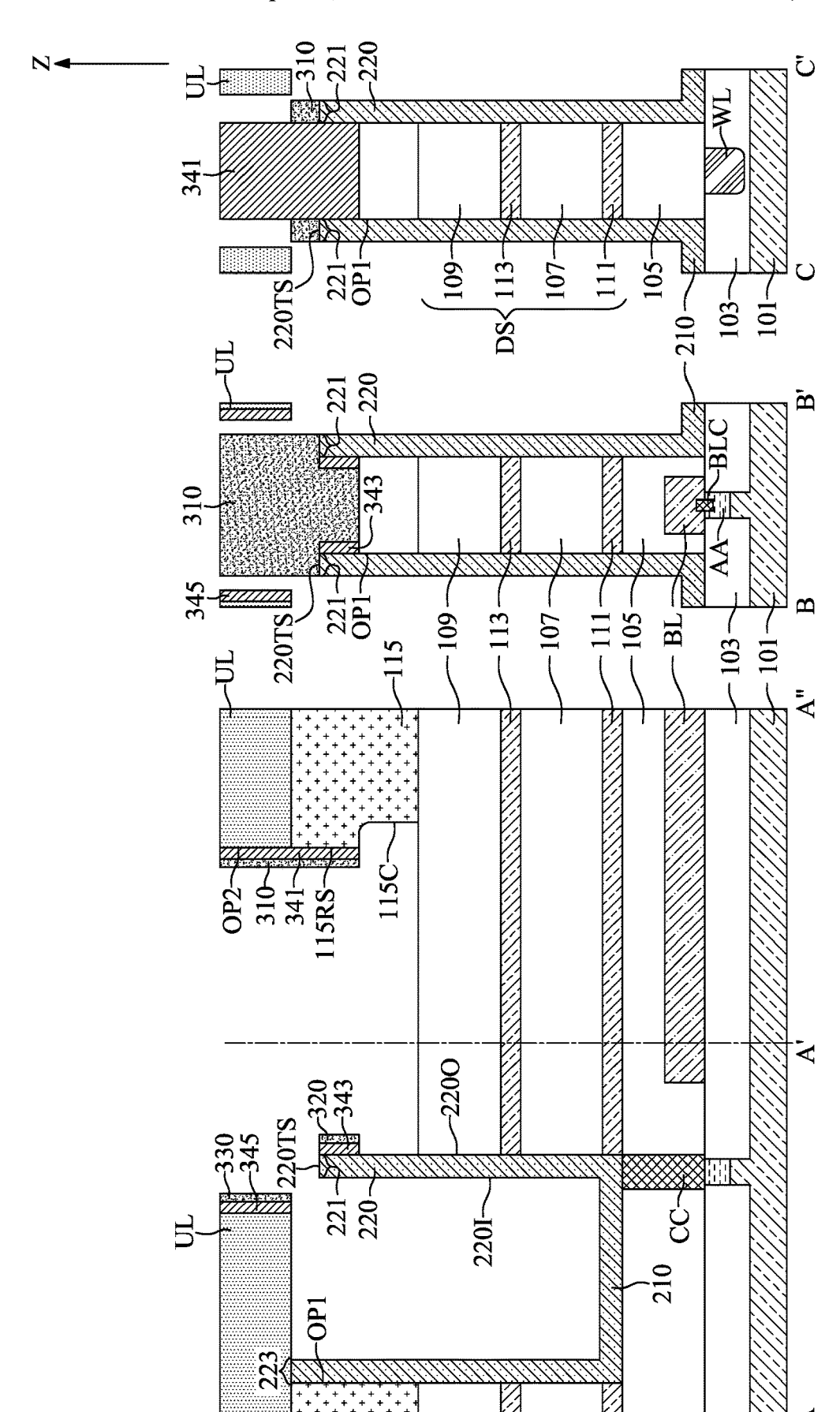

FIG. 16 illustrates, in a schematic top-view diagram, an intermediate semiconductor device in accordance with one embodiment of the present disclosure. FIGS. 17 and 18 are schematic cross-sectional view diagrams taken along lines A-A', B-B', and C-C' in FIG. 16 illustrating part of the flow for fabricating the semiconductor device 1A in accordance with one embodiment of the present disclosure.

With reference to FIG. 1 and FIGS. 16 to 18, at step S17, the sidewall portion 220 may be recessed to form a first bracing layer 310 on the first portion 341, a second bracing layer 320 on the second portion 343, and a third bracing layer 330 on the third portion 345, and the recessed portion 115R may be removed to form a side cave 115C and expose the top dielectric layer 109 of the dielectric stack DS.

With reference to FIGS. 16 and 17, in some embodiments, the sidewall portion 220 exposed through the under-layer opening OP2 (i.e., the exposed segment 221 of the sidewall portion 220) may be recessed by an etching process. In some embodiments, the etching process may use an etchant including argon, chlorine, and nitrogen. The employment of nitrogen in the etchant may be beneficial for formation of by-product polymers such as titanium tetrafluoride and/or titanium oxide. During the etching process, by-product polymers may attach on the protection layer 340 to form the first bracing layer 310, the second bracing layer 320, and the third bracing layer 330.

Detailedly, the first bracing layer 310 may be conformally formed on the first portion 341 and on the top surface 220TS of the exposed segment 221 of the sidewall portion 220. The first bracing layer 310 may serve to connect two adjacent sidewall portions 220, thereby stabilizing the bottom electrodes 200. The second bracing layer 320 may be conformally formed on the second portion 343 and connected to the first bracing layer 310. The second bracing layer 320 may be designed to link two adjacent first bracing layers 310, thereby further enhancing the stability of the first bracing layer 310. The third bracing layer 330 may be conformally formed on the third portion 345.

It should be noted that after recessing, the top surface 220TS of the exposed segment 221 of the sidewall portion 220 may still be higher than the top surface 115RT of the recessed portion 115R.

With reference to FIG. 18, the recessed portion 115R may be removed to expose the top dielectric layer 109 of the dielectric stack DS. In some embodiments, the removal of the recessed portion 115R may be achieved by an etching process using an etchant including sulfur hexafluoride and argon. Owing to the shielding provided by the protection layer 340, the first bracing layer 310, the second bracing layer 320, and the third bracing layer 330, the majority of the top supporting layer 115 may remain intact during the etching, with only the recessed portion 115R being removed. However, a portion of the top supporting layer 115 located beneath the first portion 341 and the first bracing layer 310 may also be removed due to side-etching, resulting in the formation of the side cave 115C. The side cave 115C may expand the exposed area of the top dielectric layer 109, which is advantageous for its subsequent removal.

Figure 19:
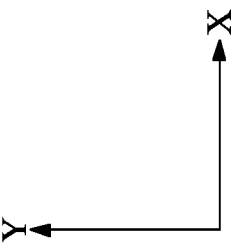
FIG. 19 illustrates, in a schematic top-view diagram, an intermediate semiconductor device in accordance with one embodiment of the present disclosure.
Figure 20:
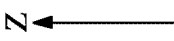
FIG. 20 is a schematic cross-sectional view diagram taken along lines A-A', B-B', and C-C' in FIG. 19 illustrating part of the flow for fabricating the semiconductor device in accordance with one embodiment of the present disclosure.
Figure 21:
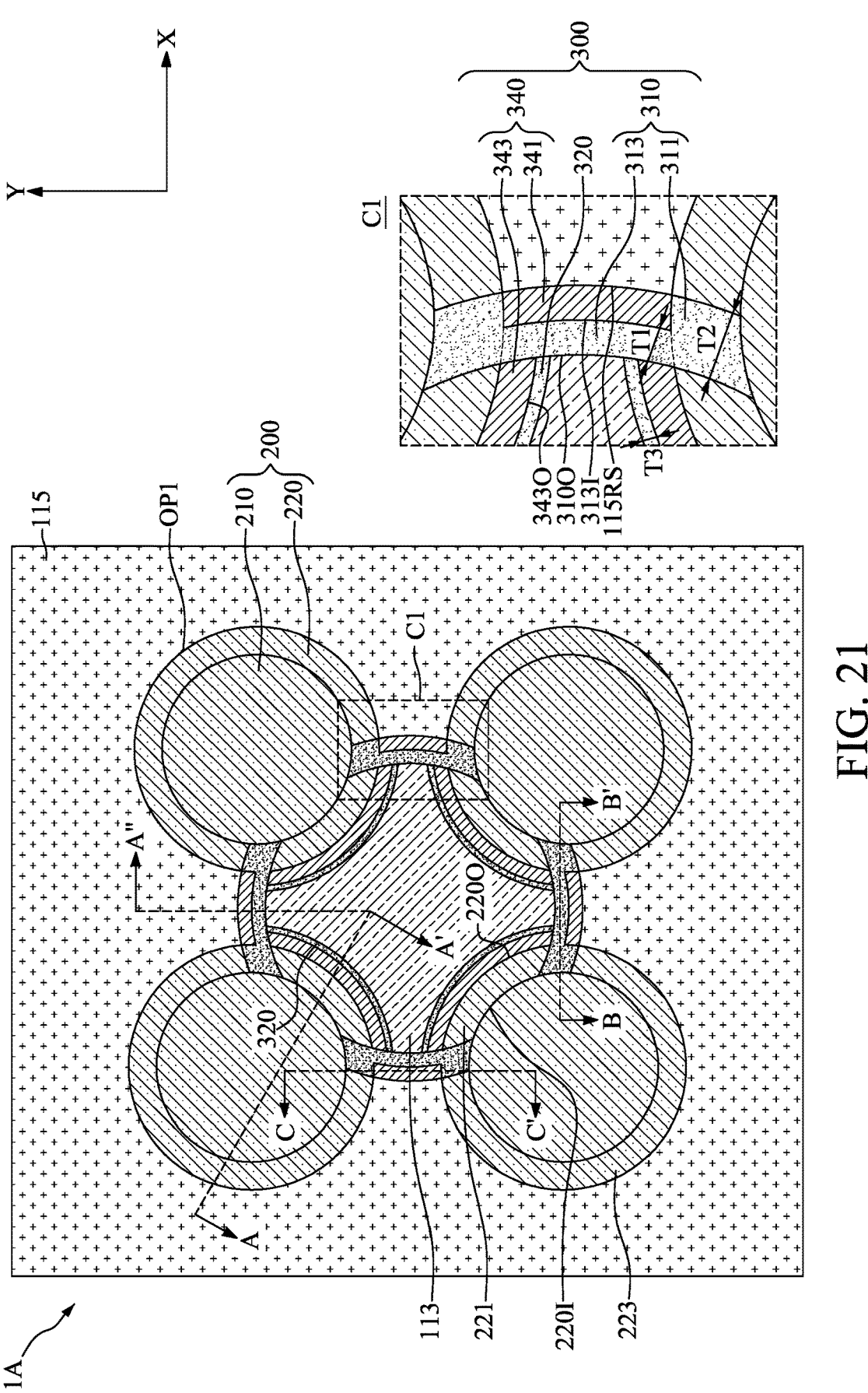
FIG. 21 illustrates, in a schematic top-view diagram, an intermediate semiconductor device in accordance with one embodiment of the present disclosure.
Figure 22:
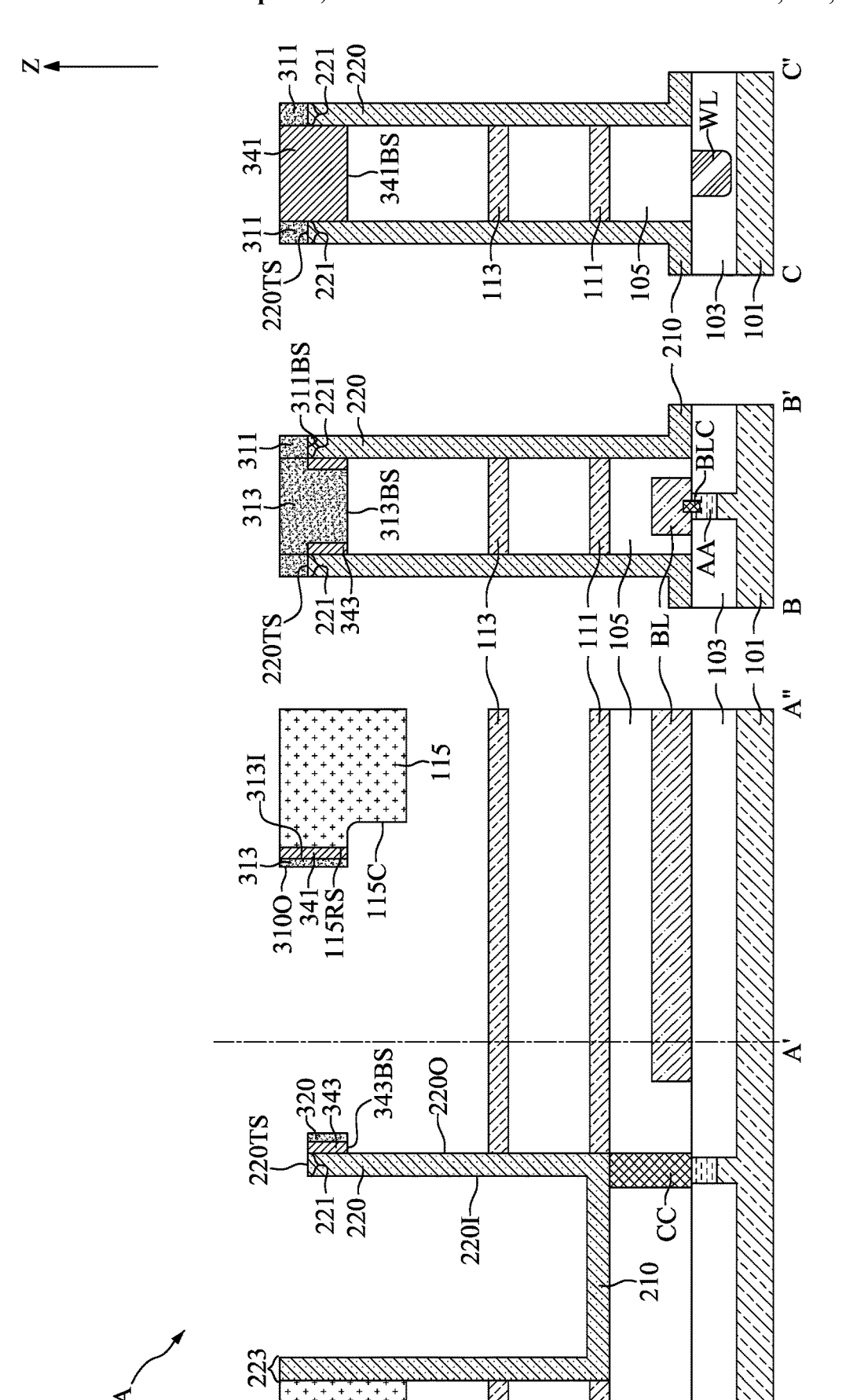
FIG. 22 is a schematic cross-sectional view diagram taken along lines A-A', B-B', and C-C' in FIG. 21 illustrating part of the flow for fabricating the semiconductor device in accordance with one embodiment of the present disclosure.

FIG. 19 illustrates, in a schematic top-view diagram, an intermediate semiconductor device in accordance with one embodiment of the present disclosure. FIG. 20 is a schematic cross-sectional view diagram taken along lines A-A', B-B', and C-C' in FIG. 19 illustrating part of the flow for fabricating the semiconductor device 1A in accordance with one embodiment of the present disclosure. FIG. 21 illustrates, in a schematic top-view diagram, an intermediate semiconductor device in accordance with one embodiment of the present disclosure. C1 provides a close-up view of the area within the dashed lines shown in FIG. 21. FIG. 22 is a schematic cross-sectional view diagram taken along lines A-A', B-B', and C-C' in FIG. 21 illustrating part of the flow for fabricating the semiconductor device 1A in accordance with one embodiment of the present disclosure.

With reference to FIG. 1 and FIGS. 19 to 22, at step S19, the under layer UL may be removed, and the top dielectric layer 109 and the middle dielectric layer 107 of the dielectric stack DS may be removed.

With reference to FIGS. 19 and 20, the under layer UL may be removed, leading to the concurrent removal of both the third portion 345 of the protection layer 340 and the third bracing layer 330, which are formed on the under layer UL.

With reference to FIGS. 21 and 22, the top dielectric layer 109 and the middle dielectric layer 107 may be removed by, for example, a wet etching process. The majority of the outer surface 220O of the sidewall portion 220 may be exposed after the removal of the middle dielectric layer 107 and the top dielectric layer 109. An insulating layer (not shown for clarity) and a top electrode (not shown for clarity) may be subsequently formed to configure a capacitor structure (not shown for clarity) in conjunction with the bottom electrode 200.

With reference to FIGS. 21 and 22, the first bracing layer 310, the second bracing layer 320, and the protection layer 340 collectively form a support bracing structure 300. The support bracing structure 300 may serve to connect two adjacent bottom electrodes 200, thereby enhancing the structure stability of the bottom electrodes 200 and preventing their wobbling.

In some embodiments, the first bracing layer 310 may be disposed substantially parallel to the sidewall portion 220. In some embodiments, the first bracing layer 310 may include two connection portions 311 and a frame portion 313. The two connection portions 311 may be respectively and correspondingly disposed on the top surfaces 220TS of the (recessed) exposed segment 221 of the sidewall portion 220 of the two adjacent bottom electrodes 200. The frame portion 313 may be formed between the two connection portions 311 and connecting (or bridging) the two connection portions 311. The first bracing layer 310 may serve to connect two adjacent bottom electrodes 200, thereby enhancing the structure stability of the bottom electrodes 200 and preventing their wobbling.

In some embodiments, the thickness T1 of the frame portion 313 may be less than the thickness T2 of the two connection portions 311. In some embodiments, the bottom surface 313BS of the frame portion 313 may be lower than the bottom surfaces 311BS of the two connection portions 311 or the top surfaces 220TS of the exposed segment 221 of the sidewall portion 220 of the two adjacent bottom electrodes 200.

In some embodiments, the frame portion 313 may include an inner surface 313I facing towards the top supporting layer 115. The outer surface 310O of the first bracing layer 310 may be disposed opposite to the inner surface 313I. That is, the outer surface 310O may face away from the top supporting layer 115. In some embodiments, the outer surface 310O may be curved in a top-view perspective.

In some embodiments, the first portion 341 of the protection layer 340 may be disposed on and conform to the inner surface 313I of the frame portion 313. The first portion 341 may be disposed between the two connection portions 311, and between the frame portion 313 and the top supporting layer 115. The bottom surface 341BS of the first portion 341 and the bottom surface 313BS of the frame portion 313 may be substantially coplanar.

In some embodiments, the second portion 343 of the protection layer 340 may be disposed on and conform to the outer surface 220O of the exposed segment 221 of the sidewall portion 220. In some embodiments, the end of second portion 343 may connect to the first portion 341. In some embodiments, the bottom surface 343BS of the second portion 343 and the bottom surface 341BS of the first portion 341 may be substantially coplanar. In some embodiments, the second portion 343 may include an outer surface 343O that faces away from the outer surface 220O of the exposed segment 221 of the sidewall portion 220.

In some embodiments, the second bracing layer 320 may be disposed on and conform to the outer surface 343O of the second portion 343 of the protection layer 340. In some embodiments, the second bracing layer 320 may connect to the outer surface 310O of the first bracing layer 310. In some embodiments, the second bracing layer 320 may serve to link two adjacent first bracing layers 310, thereby further enhancing the stabilizing capability of the support bracing structure 300. In some embodiments, the thickness T3 of the second bracing layer 320 and the thickness T1 of the frame portion 313 may be different. In some embodiments, the thickness T3 of the second bracing layer 320 and the thickness T1 of the frame portion 313 may be substantially the same.

Figure 23:
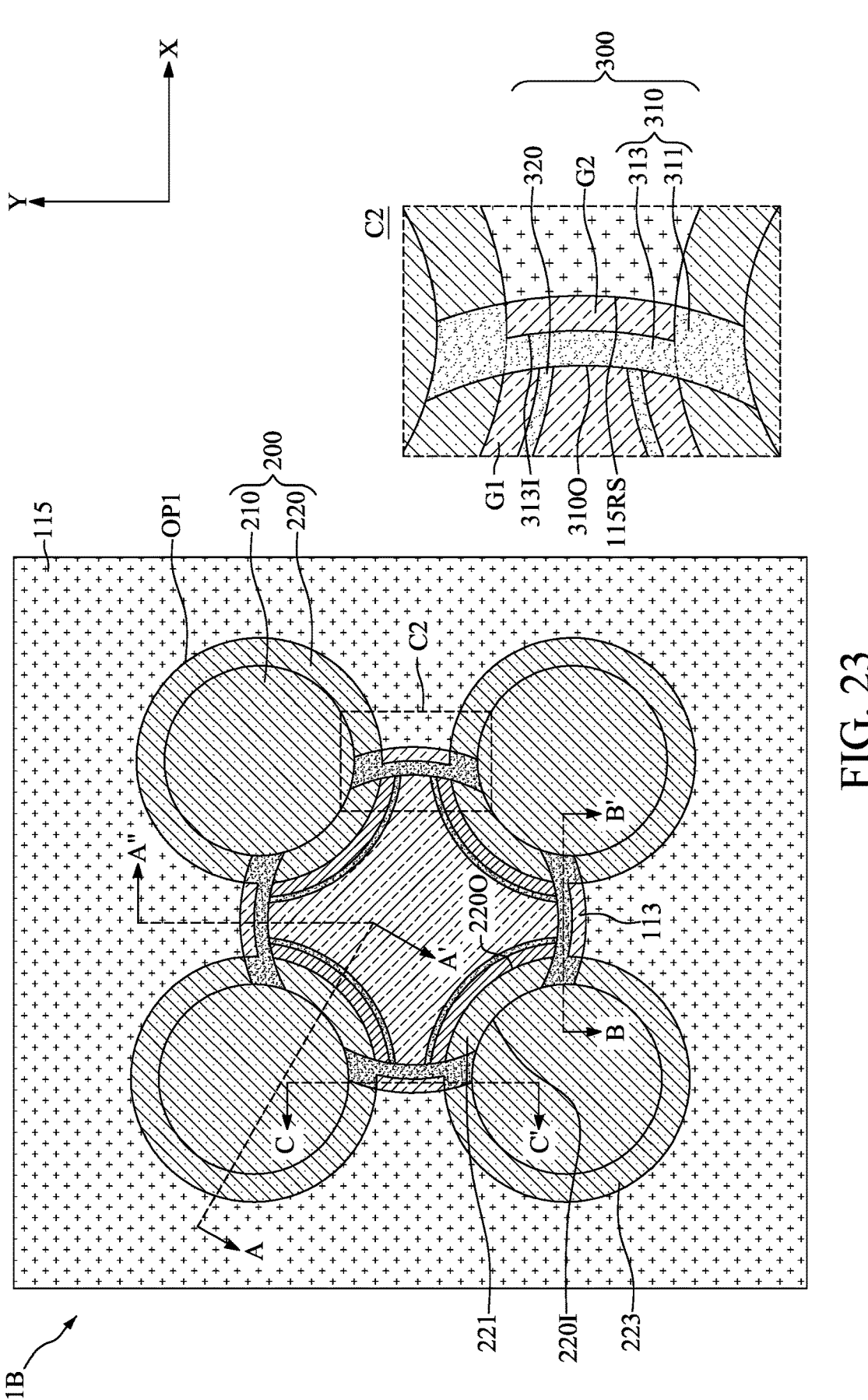
FIG. 23 illustrates, in a schematic top-view diagram, an intermediate semiconductor device in accordance with another embodiment of the present disclosure.
Figure 24:
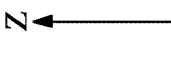
FIG. 24 is a schematic cross-sectional view diagram taken along lines A-A', B-B', and C-C' in FIG. 23 illustrating part of a flow for fabricating a semiconductor device in accordance with another embodiment of the present disclosure.

FIG. 23 illustrates, in a schematic top-view diagram, an intermediate semiconductor device in accordance with another embodiment of the present disclosure. C2 provides a close-up view of the area within the dashed lines shown in FIG. 23. FIG. 24 is a schematic cross-sectional view diagram taken along lines A-A', B-B', and C-C' in FIG. 23 illustrating part of a flow for fabricating a semiconductor device 1A in accordance with another embodiment of the present disclosure.

With reference to FIGS. 23 and 24, the semiconductor device 1B may have a structure similar to that illustrated in FIGS. 21 and 22. The same or similar elements in FIGS. 23 and 24 as in FIGS. 21 and 22 have been marked with similar reference numbers and duplicative descriptions have been omitted.

In the semiconductor device 1B, the protection layer 340 may be removed. A gap G1 may be formed between the second bracing layer 320 and the outer surface 220O of the exposed segment 221 of the sidewall portion 220. A gap G2 may be formed between the frame portion 313 and the sidewall 115RS. A gap G3 may be formed between the frame portion 313 and the outer surface 220O of the exposed segment 221 of the sidewall portion 220.

One aspect of the present disclosure provides a support bracing structure including a first bracing layer including two connection portions respectively positioned on top surfaces of two adjacent bottom electrodes, and a frame portion bridging the two connection portions; and a protection layer including a first portion positioned on and conforming to an inner surface of the frame portion and positioned between the two connection portions. The inner surface of the frame portion is normal to the top surfaces of the two adjacent bottom electrodes.

Another aspect of the present disclosure provides a semiconductor device including a substrate; at least two bottom electrodes positioned over the substrate and adjacent to each other; and a support bracing structure bridging the at least two bottom electrodes, wherein the support bracing structure includes a first bracing layer positioned on both top surfaces of the at least two adjacent bottom electrodes.

Another aspect of the present disclosure provides a method for fabricating a semiconductor device including providing a substrate, forming a dielectric stack over the substrate with a top supporting layer atop, and forming a plurality of cell holes in the dielectric stack; forming at least two adjacent bottom electrodes in the plurality of cell holes, wherein the at least two adjacent bottom electrodes respectively includes a bottom portion oriented parallel to the substrate and a sidewall portion extending normally and upwardly from a border of the bottom portion; forming an under layer over the top supporting layer, and forming an under-layer opening penetrating the under layer to partially expose the at least two adjacent bottom electrodes and the top supporting layer; recessing the top supporting layer to form a recessed portion of the top supporting layer that partially exposes outer surfaces of the sidewall portions of the at least two adjacent bottom electrodes; conformally forming a first portion of a protection layer on a sidewall of the recessed portion and a second portion of the protection layer on the outer surfaces of the sidewall portions; and recessing the sidewall portions to form a first bracing layer and a second bracing layer, wherein the first bracing layer is formed on both the first portion and top surfaces of the sidewall portions, and the second bracing layer is formed on the second portion. The first bracing layer, the second bracing layer, and the protection layer together configure a support bracing structure.

Due to the design of the semiconductor device of the present disclosure, the structure stability of the two adjacent bottom electrodes 200 may be enhanced through the connection via the support bracing structure 300. This stabilization may prevent wobbling of the electrodes 200, thereby increasing the yield of the semiconductor device 1A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A method for fabricating a semiconductor device, comprising:

providing a substrate, forming a dielectric stack over the substrate with a top supporting layer atop, and forming a plurality of cell holes in the dielectric stack;

forming at least two adjacent bottom electrodes in the plurality of cell holes, wherein the at least two adjacent bottom electrodes respectively comprises a bottom portion oriented parallel to the substrate and a sidewall portion extending normally and upwardly from a border of the bottom portion;

forming an under layer over the top supporting layer, and forming an under-layer opening penetrating the under layer to partially expose the at least two adjacent bottom electrodes and the top supporting layer;

recessing the top supporting layer to form a recessed portion of the top supporting layer that partially exposes outer surfaces of the sidewall portions of the at least two adjacent bottom electrodes;

conformally forming a first portion of a protection layer on a sidewall of the recessed portion and a second portion of the protection layer on the outer surfaces of the sidewall portions; and recessing the sidewall portions to form a first bracing layer and a second bracing layer, wherein the first bracing layer is formed on both the first portion and top surfaces of the sidewall portions, and the second bracing layer is formed on the second portion;

wherein the first bracing layer, the second bracing layer, and the protection layer together configure a support bracing structure.

2. The method for fabricating the semiconductor device of claim 1, wherein the top surfaces of the sidewall portions are higher than a top surface of the recessed portion.

3. The method for fabricating the semiconductor device of claim 2, wherein recessing the top supporting layer is achieved by performing an etching process using an etchant comprising sulfur hexafluoride, argon, and chlorine.

4. The method for fabricating the semiconductor device of claim 2, wherein the protection layer comprises an oxide.

5. The method for fabricating the semiconductor device of claim 2, wherein recessing the sidewall portions is achieved by performing an etching process using an etchant comprising argon, chlorine, and nitrogen.

6. The method for fabricating the semiconductor device of claim 2, further comprising removing the recessed portion of the top supporting layer to form a side cave adjacent and underneath the first portion of the protection layer, and to expose a top dielectric layer of the dielectric stack.

7. The method for fabricating the semiconductor device of claim 6, wherein removing the recessed portion of the top supporting layer is achieved by performing an etching process using an etchant comprising sulfur hexafluoride and argon.

8. The method for fabricating the semiconductor device of claim 6, wherein the first bracing layer and the second bracing layer comprises titanium tetrafluoride or titanium oxide.

9. The method for fabricating the semiconductor device of claim 2, further comprising removing the under layer after recessing the sidewall portions.

10. The method for fabricating the semiconductor device of claim 1, wherein the top supporting layer comprises silicon nitride.

\* \* \* \* \*